(12) United States Patent
Kim et al.

(10) Patent No.: US 10,388,605 B2
(45) Date of Patent: Aug. 20, 2019

(54) SEMICONDUCTOR DEVICE AND METHOD OF MANUFACTURING THE SAME

(71) Applicant: SK hynix Inc., Icheon-si, Gyeonggi-do (KR)

(72) Inventors: Tae Kyung Kim, Cheongju-si (KR); Chul Young Park, Yeoju-si (KR); Hyoung Soon Yune, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/967,086

(22) Filed: Apr. 30, 2018

(65) Prior Publication Data

US 2018/0247894 A1  Aug. 30, 2018

Related U.S. Application Data

(63) Continuation of application No. 15/402,893, filed on Jan. 10, 2017, now Pat. No. 9,984,972.

(30) Foreign Application Priority Data

Jul. 5, 2016 (KR) .................. 10-2016-0084914

(51) Int. Cl.
| | |
|---|---|
| *H01L 23/528* | (2006.01) |
| *H01L 23/522* | (2006.01) |
| *H01L 21/768* | (2006.01) |
| *H01L 27/02* | (2006.01) |
| *H01L 27/11556* | (2017.01) |
| *H01L 27/11582* | (2017.01) |

(52) U.S. Cl.
CPC .... *H01L 23/5283* (2013.01); *H01L 21/76804* (2013.01); *H01L 21/76816* (2013.01); *H01L 21/76877* (2013.01); *H01L 23/5226* (2013.01); *H01L 27/0207* (2013.01); *H01L 27/11556* (2013.01); *H01L 27/11582* (2013.01)

(58) Field of Classification Search
CPC .................. H01L 23/5283; H01L 23/5226
See application file for complete search history.

(56) References Cited

U.S. PATENT DOCUMENTS

| | | | |
|---|---|---|---|
| 5,526,303 A | 6/1996 | Okajima | |
| 6,552,409 B2 | 4/2003 | Taussig et al. | |
| 9,431,412 B1 | 8/2016 | Kato et al. | |
| 2003/0085428 A1 | 5/2003 | Nelson et al. | |
| 2004/0095491 A1 | 5/2004 | Okada | |
| 2006/0286750 A1 | 12/2006 | Fang et al. | |
| 2007/0128798 A1* | 6/2007 | Lee ................ | H01L 21/26506 438/257 |
| 2008/0048267 A1 | 2/2008 | Richardson et al. | |
| 2010/0044774 A1* | 2/2010 | Kim ................ | H01L 21/76831 257/321 |
| 2016/0071860 A1* | 3/2016 | Kai ................ | H01L 27/11556 257/321 |
| 2016/0254348 A1 | 9/2016 | Bhuwalka et al. | |

FOREIGN PATENT DOCUMENTS

| | | |
|---|---|---|
| KR | 1020150001204 A | 1/2015 |
| KR | 1020150058597 A | 5/2015 |

* cited by examiner

*Primary Examiner* — Sitaramarao S Yechuri
(74) *Attorney, Agent, or Firm* — William Park & Associates Ltd.

(57) ABSTRACT

A semiconductor device may include a first pattern. The semiconductor device may include a second pattern intersecting with the first pattern and including an intersection region with the first pattern and a non-intersection region.

19 Claims, 11 Drawing Sheets

SEMICONDUCTOR DEVICE AND METHOD OF MANUFACTURING THE SAME

CROSS-REFERENCE TO RELATED APPLICATION

The present application is a continuation application of U.S. Ser. No. 15/402,893 and claims priority under 35 U.S.C. § 119(a) to Korean patent application number 10-2016-0084914 filed on Jul. 5, 2016 in the Korean Intellectual Property Office, the entire disclosure of which is incorporated herein by reference.

BACKGROUND

1. Technical Field

Various embodiments of the present disclosure may generally relate to an electronic device and a method of manufacturing the same, and more particularly, to a three-dimensional semiconductor device and a method of manufacturing the same.

2. Related Art

Non-volatile memory devices retain stored data regardless of power on and off (on/off) conditions. Recently, because the improvement of integration of a two-dimensional non-volatile memory device including memory cells formed on a substrate in a single layer is limited, a three-dimensional non-volatile memory device including memory cells stacked in a vertical direction on a substrate has been proposed.

A three-dimensional memory device may include interlayer insulating layers and gate electrodes that are stacked alternately with each other, and channel layers passing therethrough, with memory cells stacked along the channel layers. To improve the operational reliability of such a non-volatile memory device having a three-dimensional structure, various structures and manufacturing methods have been developed.

SUMMARY

According to an embodiment, a method of manufacturing a semiconductor device may be provided. According to an embodiment, a semiconductor device may be provided. The semiconductor device may include a first pattern. The semiconductor device may include a second pattern intersecting with the first pattern and including an intersection region with the first pattern and a non-intersection region.

DETAILED DESCRIPTION

Figure 1:
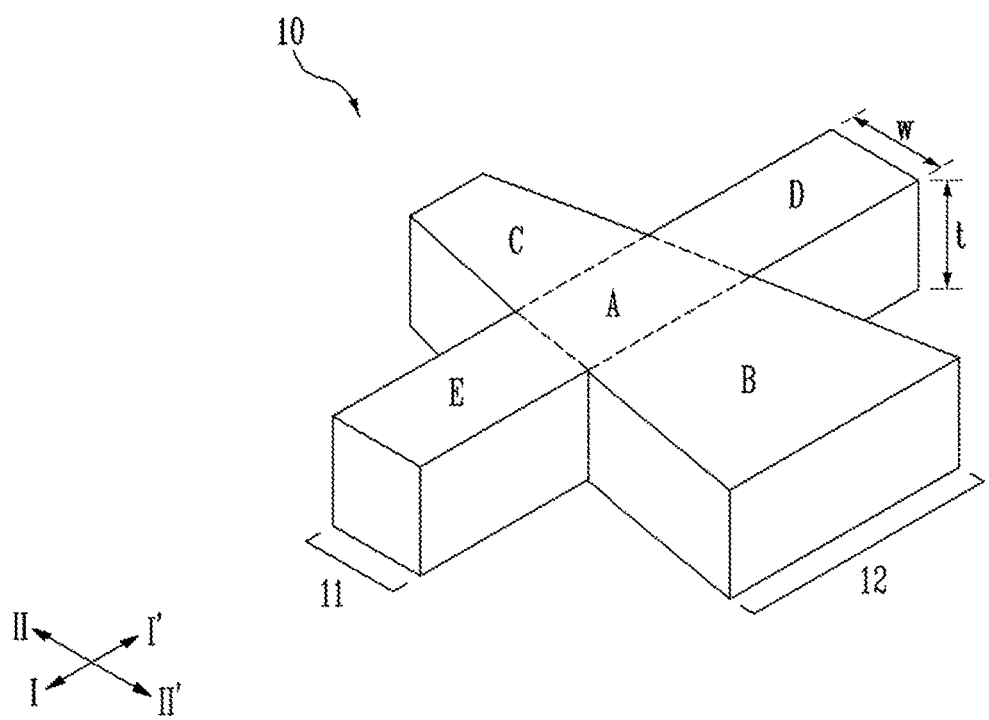
FIG. 1 is a perspective view illustrating a representation of an example of the structure of an intersection pattern in accordance with an embodiment of the present disclosure.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a perspective view illustrating a representation of an example of the structure of an intersection pattern in accordance with an embodiment of the present disclosure.

Referring to FIG. 1, an intersection pattern 10 according to an embodiment of the present disclosure includes a first pattern 11 which extends in a first direction I-I', and a second pattern 12 which extends in a second direction II-II' intersecting with the first direction I-I'. The intersection pattern 10 has a predetermined width w and a predetermined thickness t. The width w and/or thickness t may vary depending on regions. Furthermore, the thickness t may have a value greater than that of the width w. The intersection pattern 10 may have a shape with a comparatively large aspect ratio.

The first pattern 11 and the second pattern 12 may include materials having the same property. For example, the intersection pattern 10 may include insulating material such as an oxide. Thus, each of the first and second patterns may be an insulating pattern. In addition, the intersection pattern 10 may be a slit insulating layer formed in a stack having a large aspect ratio.

The intersection pattern 10 may include an intersection region A and non-intersection regions B, C, D and E. At least one non-intersection region (for example, B) among the non-intersection regions B, C, D and E may have a width greater than that of the intersection region A. For example, in the case where the intersection region A has a non-uniform width, the intersection region A may have a cross-section having a trapezoidal shape, a ribbon shape or the like. The non-intersection region B may have a shape in which as the distance from the intersection region A increases, the width thereof is increased. For example, the non-intersection region B may have a shape in which the width thereof is increased at a constant rate. The non-intersection region B may have a width equal to or greater than the maximum width of the intersection region A.

The first pattern 11 and the second pattern 12 may be simultaneously formed through a single process, or separately formed through separate processes. Therefore, the first pattern 11 and the second pattern 12 may be made of the same material or different materials. For instance, if the second pattern 12 is formed after the first pattern 11 has been formed, the intersection region A and the non-intersection regions B and C may be made of the same material. In another example, if the first pattern 11 is formed after the second pattern 12 has been formed, the intersection region A and the non-intersection regions D and E may be made of the same material.

For reference, each of the non-intersection regions C, D and E may also have a shape in which as the distance from the intersection region A increases, the width thereof is increased. The non-intersection region C and the non-intersection region B that face each other with the intersection region A interposed therebetween may have a symmetrical shape or an asymmetrical shape.

FIGS. 2A to 2F are views illustrating representations of example of the structures of a semiconductor devices in accordance with various embodiments of the present disclosure and are layout views illustrating the sectional shapes of the intersection patterns.

Referring to FIGS. 2A to 2F, an intersection pattern 20 according to an embodiment of the present disclosure may include a first pattern 21 which extends in a first direction I-I', and a second pattern 22 which extends in a second direction II-II' intersecting with the first direction I-I'. Hereinafter, for the sake of explanation, widths and shapes of an intersection region and non-intersection regions will be described, focused on the second pattern 22.

Figure 2A:
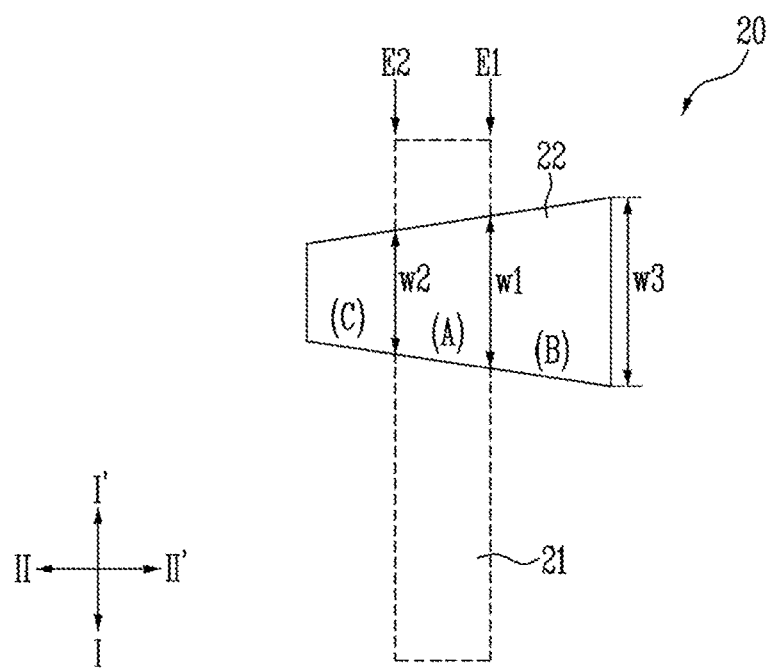
FIGS. 2A to 2F are views illustrating representations of examples of the structures of a semiconductor devices in accordance with various embodiments of the present disclosure.

Referring to FIG. 2A, the second pattern 22 may include an intersection region A and non-intersection regions B and C and have a tapered shape in which the width thereof is increased in the second direction II-II'. The intersection region A of the second pattern 22 may increase in width at a constant rate and have a trapezoidal shape. In an embodiment, the second pattern 22 may have a tapered shape in which the width of the second pattern 22 is increased along a longitudinal direction of the second pattern.

The first pattern 21 may have a line shape with a constant width and include a first edge E1 and a second edge E2 which extend parallel to each other. Based on the first edge E1 and the second edge E2, the intersection region A and the non-intersection regions B and C are defined. The second pattern 22 has a first width w1 on the first edge E1 of the first pattern 21 and has a second width w2 on the second edge E2 of the second pattern 22. The first width w1 may have a value greater than the second width w2. An end of the second pattern 22 that is adjacent to the first edge E1 of the first line pattern 21 has a third width w3. The third width w3 may have a value greater than the first width w1.

Figure 2B:
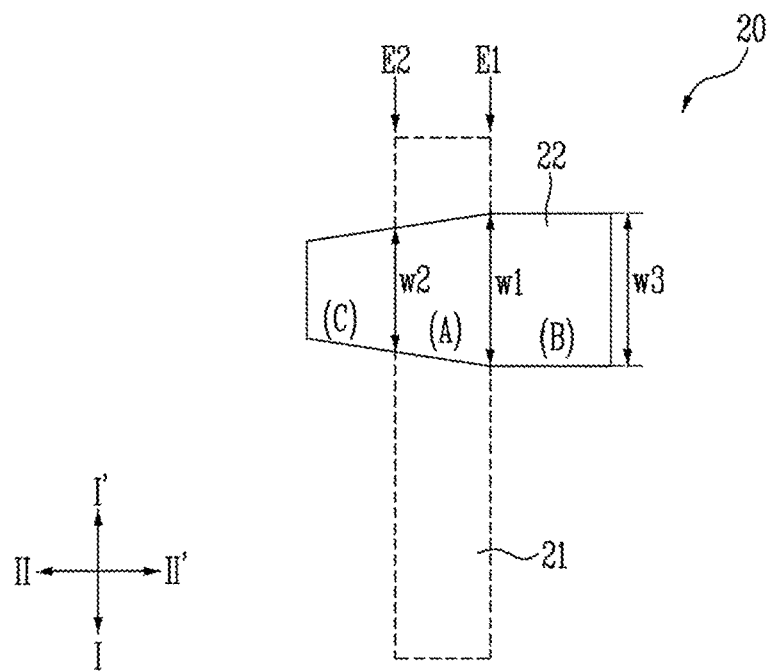

Referring to FIG. 2B, the second pattern 22 has the first width w1 on the first edge E1, and the end of the second pattern 22 has the third width w3. The first width w1 and the third width w3 may substantially have the same values. The words "substantially same" refer to that two values fall within a range including a processing tolerance. In this case, the non-intersection region B has a uniform width.

Figure 2C:
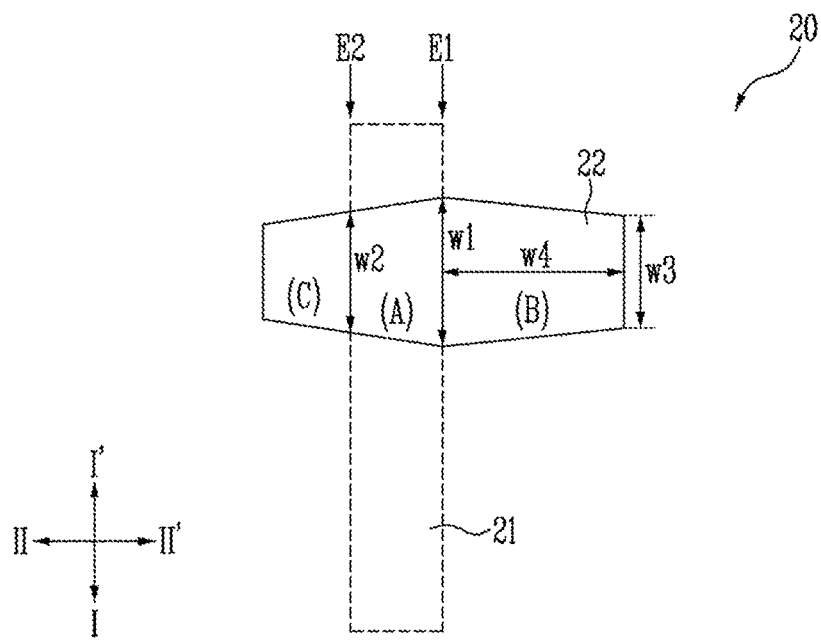

Referring to FIG. 2C, the second pattern 22 has a first width w1 on the first edge E1 of the first pattern 21, has a second width w2 on the second edge E2 of the second pattern 22, and has a third width w3 on an end thereof. The distance between the first edge E1 and the end of the second pattern 22 corresponds to a fourth width w4. The first width w1 may have a value greater than the second width w2. The fourth width w4 may have a value greater than ½ of the first width w1. For example, in the case where the second pattern 22 is first formed, the fourth width w4 may have a value greater than ½ of the first width w1. In the case where the first pattern 21 is first formed, the fourth width w4 may have a value greater than the first width w1. The third width w3 may have a value less than the first width w1 and greater than the second width w2.

Figure 2D:
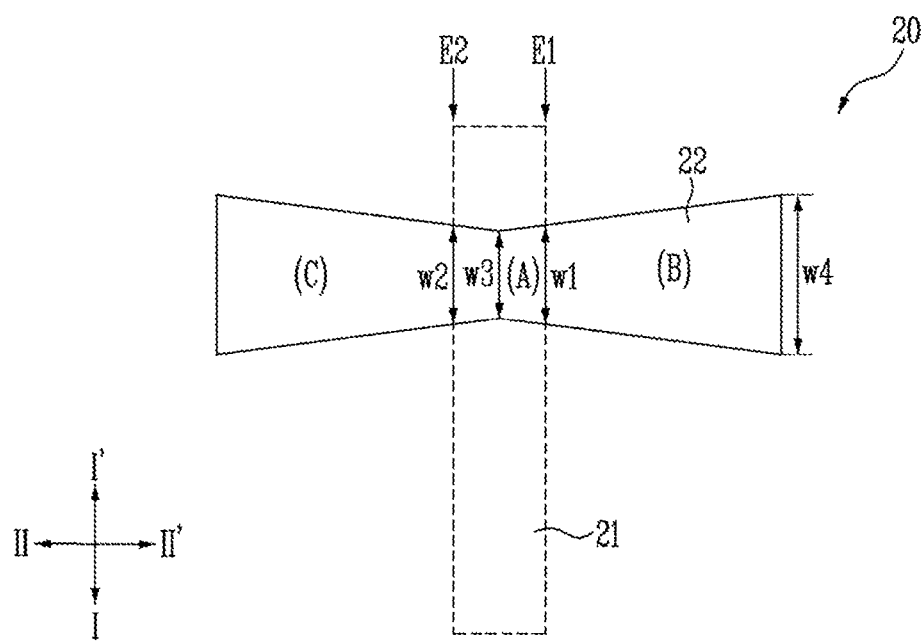

Referring to FIG. 2D, the second pattern 22 may have a shape in which it has the minimum width on the center of the intersection region A and is increased in width from the center of the intersection region A to both ends thereof. For example, the second pattern 22 may have a ribbon-shaped cross-section.

The second pattern 22 has a first width w1 on the first edge E1 of the first pattern 21, has a second width w2 on the second edge E2 of the first pattern 21, has a third width w3 between the first edge E1 and the second edge E2, and has a fourth width W4 on an end thereof. The third width w3 may have a value less than the first width w1 or the second width w2. The fourth width w4 may have a value greater than the first width w1 or have a substantially same value as the first width w1. The first width w1 and the second width w2 may have a substantially same value or different values.

Figure 2E:
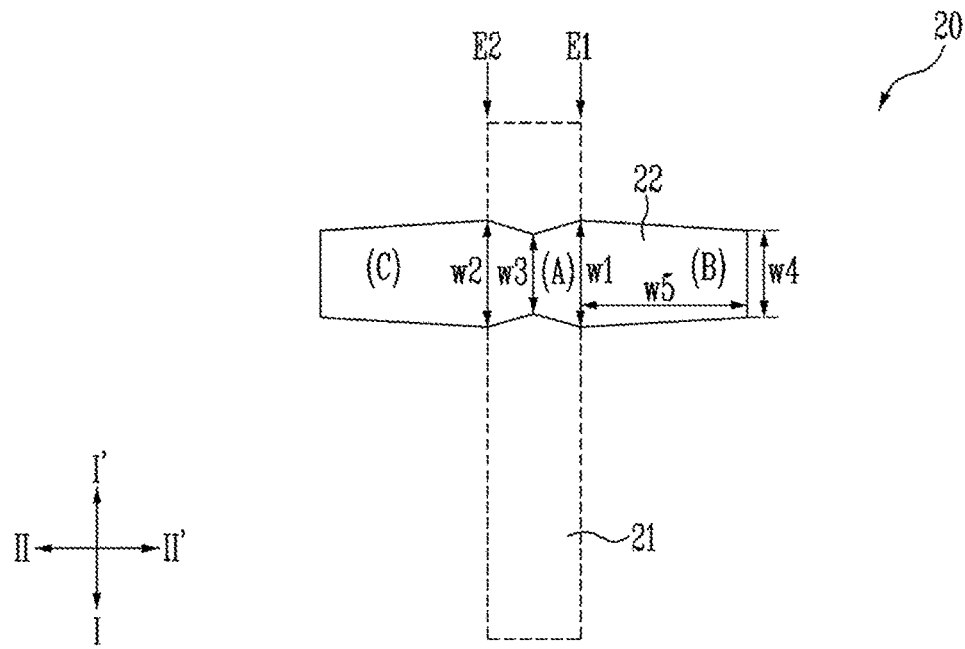

Referring to FIG. 2E, the second pattern 22 has a first width w1 on the first edge E1 of the first pattern 21, has a second width w2 on the second edge E2 of the first pattern 21, has a third width w3 between the first edge E1 and the second edge E2, and has a fourth width W4 on an end thereof. The distance between the first edge E1 and the end of the second pattern 22 corresponds to a fifth width w5. The fifth width w5 may have a value greater than ½ of the first width w1. The fourth width w4 may have a value less than the first width w1 and greater than the third width w3.

Figure 2F:
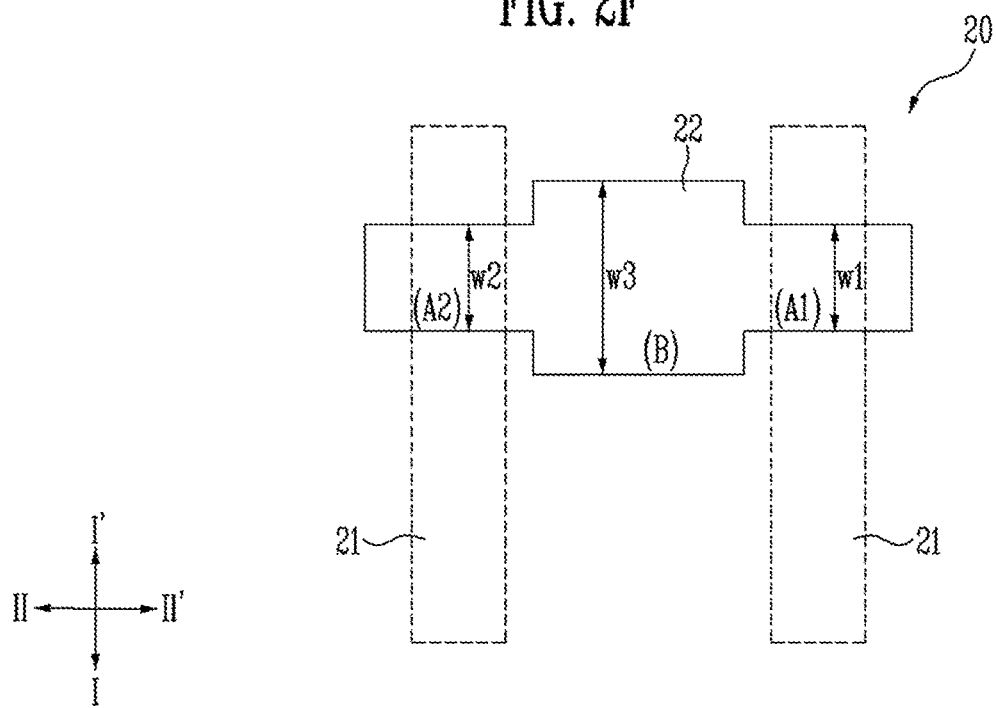

Referring to FIG. 2F, the intersection pattern 20 includes a plurality of first patterns 21 which extend in the first direction I-I', and a second pattern 22 which extends in the second direction II-II'. The second pattern 22 includes a first intersection region A1 having a first width w1, a second intersection region A2 having a second width w2, and a non-intersection region B which is disposed between the first intersection region A1 and the second intersection region A2 and has a third width w3. Each of the first width w1 and the second width w2 has a value less than the third width w3. The first width w1 and the second width w2 may be substantially the same as each other or have different values.

According to an above-mentioned structure of FIGS. 2A to 2F, in the second pattern 22, the non-intersection region B has a width greater than that of the intersection regions A, A1 and A2. Therefore, a hollow space, that is, a seam, is restricted from being formed in the intersection regions A during a process of forming the second pattern 22. Furthermore, even if the seam is formed, the seam is located in the non-intersection region B.

For reference, in a present embodiment of FIGS. 2A to 2F, while the description has been made for the case where the first pattern 21 has a uniform width and the second pattern 22 has a non-uniform width, the first pattern 21 may also have a non-uniform width. That is, the first pattern 21 may also have different widths depending on the regions and have a comparatively small width in the intersection region.

Figure 3A:
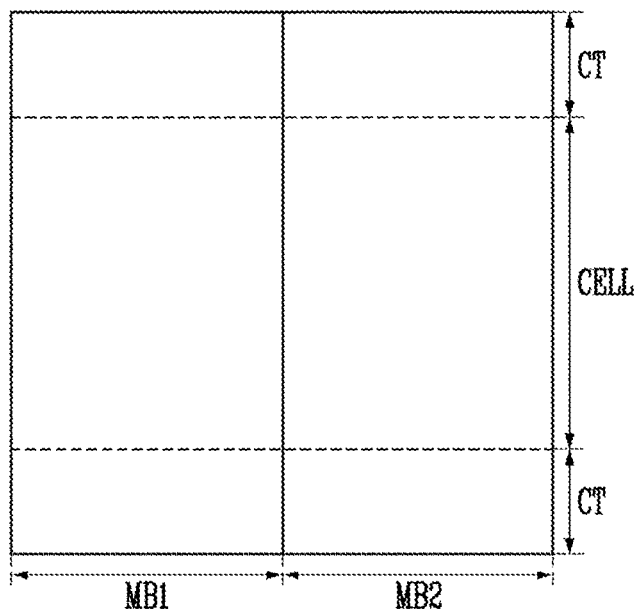
FIGS. 3A and 3B are views illustrating representations of examples of the structures of the semiconductor devices in accordance with various embodiments of the present disclosure.
Figure 3B:
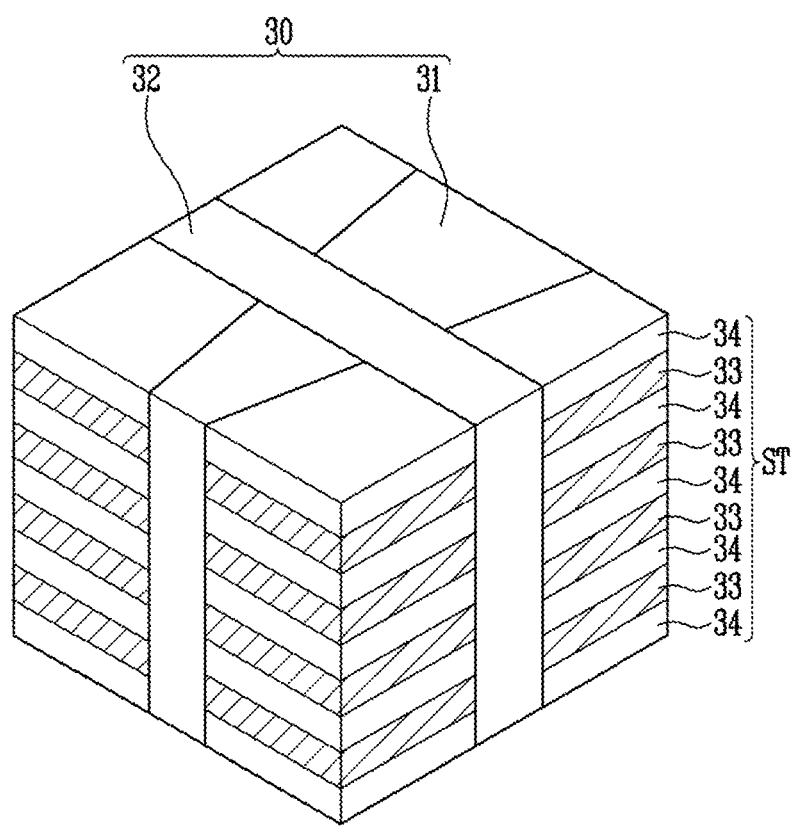

FIGS. 3A and 3B are views illustrating representations of examples of the structures of the semiconductor devices in accordance with the various embodiments of the present disclosure. FIG. 3A is a layout diagram, and FIG. 3B is a perspective diagram.

Referring to FIG. 3A, a semiconductor device according to an embodiment of the present disclosure includes a cell region CELL and a contact region CT. The cell region CELL is a region on which stacked memory cells are disposed. The contact region CT is a region on which an interconnection structure such as a contact plug for application of drive bias to the stacked memory cells is disposed. The contact region CT may be provided on each of the opposite sides of the cell region CELL. Alternatively, the contact region CT may be provided on only one side of the cell region CELL.

A stack including gate electrodes and insulating layers that are alternately stacked is disposed in the cell region CELL and the contact region CT. The stack in the contact region CT may have a stepped form such that the gate electrodes of all layers are exposed. In this regard, an exposed region of each gate electrode becomes a pad, and a contact plug is coupled to the pad.

The semiconductor device includes a plurality of memory blocks MB1 and MB2. The memory blocks MB1 and MB2 are units each of which performs an erase operation. During the erase operation, data of the memory cells included in one memory block MB1 or MB2 is erased. For reference, each of the memory blocks MB1 and MB2 includes a plurality of pages and may perform program and read operations on a page basis.

The semiconductor device includes slit insulating layers which pass through the stack and have various shapes and functions. The slit insulating layer may be disposed in a boundary between a first memory block MB1 and a second memory block MB2 so that a first stack located in the first memory block MB1 and a second stack located in the second memory block MB2 are electrically separated from each other by the slit insulating layer. The slit insulating layer may be disposed in the cell region CELL to separate a source side gate electrode and a drain side gate electrode of a U-shaped memory string from each other. The slit insulating layer may be disposed in the cell region CELL or the contact region CT to fill a slit that has been used as a passage for replacing stacked sacrificial layers with stacked gate electrodes. The slit insulating layer may be disposed in the cell region CELL or the contact region CT as a support body for supporting remaining insulating layers during the process of replacing the stacked sacrificial layers with the stacked gate electrodes. A plurality of slit insulating layers may intersect with each other and thus form an intersection pattern.

Referring to FIG. 3B, a stack ST includes conductive layers and insulating layers 34 which are alternately stacked. The conductive layers 33 may be gate electrodes of a select transistor, memory cells and the like. The insulating layer 34 may function to insulate the stacked gate electrodes from each other.

The intersection pattern 30 penetrates the stack ST in a stack direction and has a structure such that at least two patterns intersect with each other. The intersection pattern 30 may include a first slit insulating layer 31 and a second slit insulating layer 32. For example, the first slit insulating layer 31 may be provided to be used as a support body. The second slit insulating layer 32 may be formed to fill a slit that has been used as a passage for replacing the sacrificial layers with the conductive layers. In this case, after the first slit insulating layer 31 has been formed, the second slit insulating layer 32 is formed.

For reference, in this drawing, although the shape of the intersection pattern 30 described with reference to FIG. 2A has been illustrated, the shape of the intersection pattern 30 may be changed to various shapes based on the embodiments described with reference to FIGS. 2A to 2F.

FIGS. 4A to 4D are perspective views illustrating representations of examples of methods of manufacturing a semiconductor device in accordance with an embodiment of the present disclosure. Hereinafter, description will be made for an embodiment in which after the second pattern having different widths depending on regions is formed, the first pattern having a uniform width is formed. Hereinbelow, repetitive explanation will be omitted if deemed redundant.

Figure 4A:
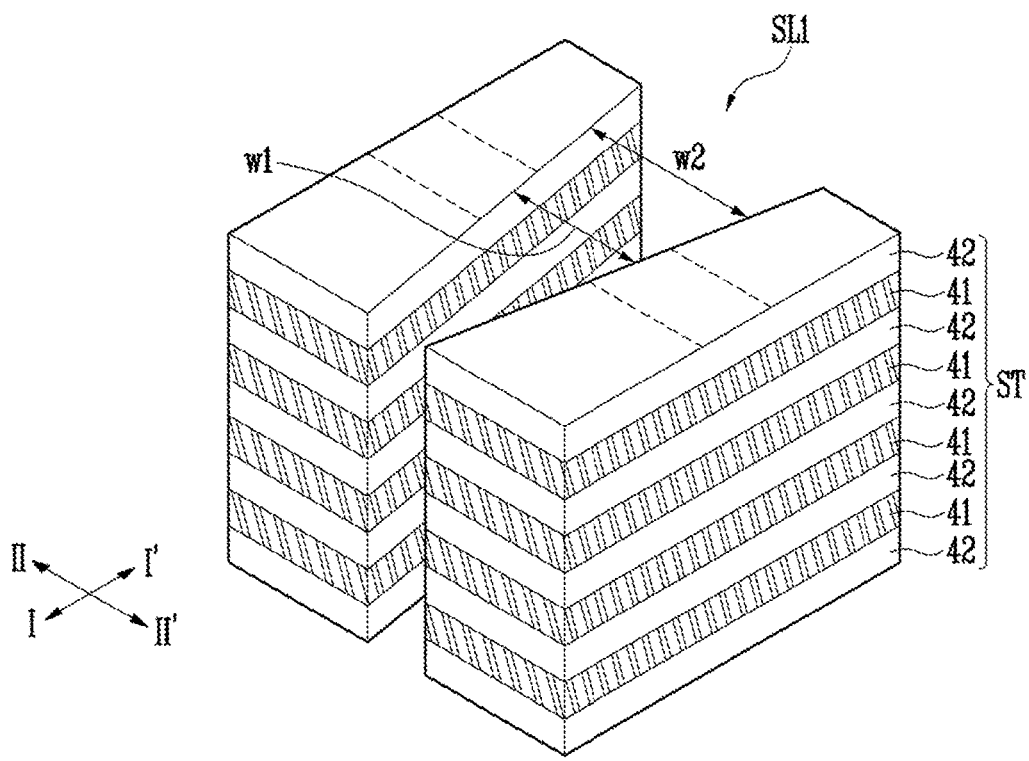
FIGS. 4A to 4D are perspective views illustrating representations of examples of methods of manufacturing a semiconductor device in accordance with an embodiment of the present disclosure.

Referring to FIG. 4A, first material layers 41 and second material layers 42 are alternately stacked, thus forming a stack ST. In this regard, the first material layers 41 may be provided to form conductive layers such as word lines, a select line and pads. The second material layers 42 may be provided to form insulating layers for insulating the stacked conductive layers from each other. For example, the first material layers 41 may be sacrificial layers including a nitride or the like, and the second material layers 42 may be insulating layers including an oxide or the like. Alternatively, the first material layers 41 may be conductive layers including polysilicon, tungsten, or the like, and the second material layers 42 may be insulating layers including an oxide or the like. As a further alternative, the first material layers 41 may be conductive layers including doped polysilicon or the like, and the second material layers 42 may be sacrificial layers including undoped polysilicon or the like.

Subsequently, although not illustrated in the drawings, channel layers penetrating the stack ST and data storage layers enclosing sidewalls of the channel layers may be formed. Each of the data storage layers may include a floating gate including silicon, a charge trap material such as a nitride, phase change material, nanodots, and so forth.

Thereafter, a first slit SL1 passing through the stack ST is formed. The first slit SL1 passes through the stack ST in the stack direction, and may have a large aspect ratio at which the depth thereof is greater than the width. The first slit SL1 may extend in the first direction I-I' and intersect with a second slit (refer to the broken lines) to be formed through the following process.

The first slit SL1 has different widths depending on regions. The first slit SL1 has a first width w1 in a region thereof and has in another region thereof a second width w2 greater than the first width w1. For example, the first slit SL1 has the first width w1 in an intersection region in which the first slit SL1 intersects with the second slit, and has in a non-intersection region the second width w2 greater than the first width w1. The shape of the first slit SL1 may be changed to various shapes, for example, a tapered shape or a ribbon shape, as described above.

Figure 4B:
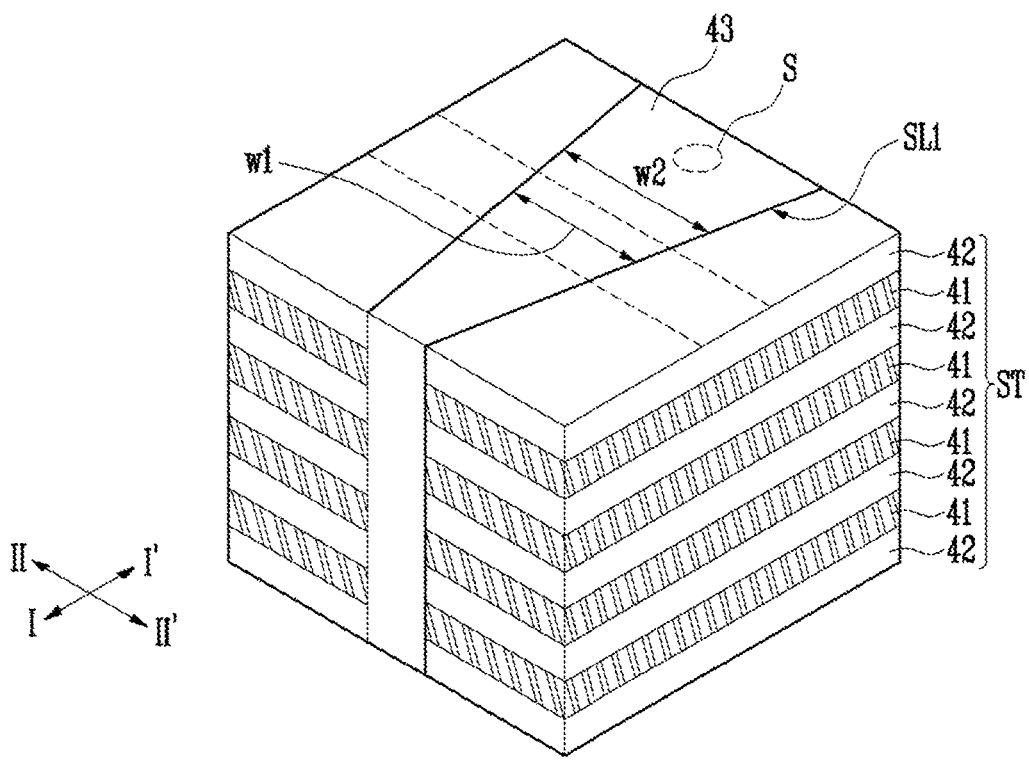

Referring to FIG. 4B, a first slit insulating layer 43 is formed in the first slit SL1. The first slit insulating layer 43 also has different widths depending on the regions, in the same manner as that of the first slit SL1. For instance, the first slit insulating layer 43 intersects with a second slit insulating layer to be formed through the following process, and has the first width w1 in the intersection region and the second width w2 in the non-intersection region. Furthermore, the first slit insulating layer 43 includes an insulating material such as an oxide.

The first slit insulating layer 43 may be formed through a deposition process such as an atomic layer deposition process. The insulating material is deposited along an inner surface of the first slit SL1, and the space in the first slit SL1 is thus filled with the insulating material. In this case, the space in the first slit SL1 may not be completely filled with the insulating material, and consequently a hollow space, that is, a seam S, may be formed. If the first slit insulating layer 43 has the seam S therein, the seam S may be exposed to the outside during the following etching process, thus affecting an etching profile. Given this, in a present embodiment, the shape of the first slit SL1 is modified such that formation of the seam S is restricted or the position of the seam S is controlled.

That is, as described above, by making the width of the first slit SL1 non-uniform, the position of the seam S may be controlled such that it is disposed in a region having a relatively large width. For example, the first slit SL1 may be formed such that the width of the intersection region of the first slit SL1 is less than that of the non-intersection region. In this case, even if the seam S is formed in the first slit insulating layer 43, the seam S is located in the non-intersection region.

Figure 4C:
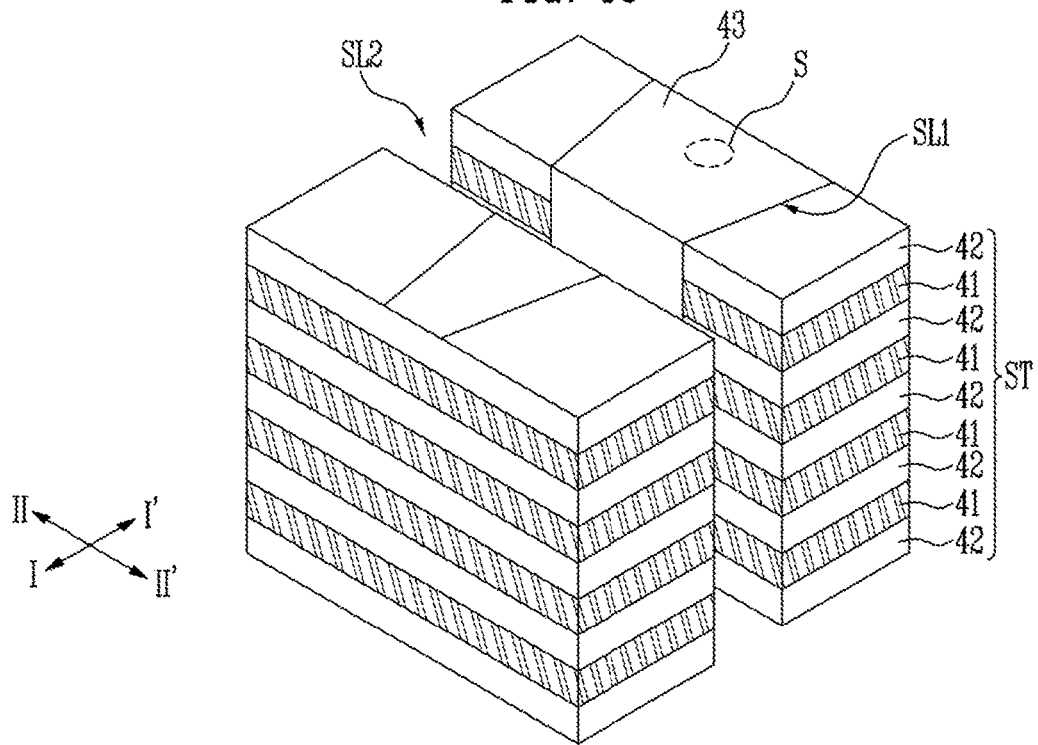

Referring to FIG. 4C, the second slit SL2 passing through the stack ST and the first slit insulating layer 43 is formed. The second slit SL2 may pass through the stack ST and the first slit insulating layer 43 in the stack direction and be formed to a predetermined depth such that all of the first material layers 41 are exposed through the second slit SL2.

The second slit SL2 intersects with the first slit insulating layer 43 and extends in the second direction II-II'.

The second slit SL2 may be formed through an etching process. In this case, if the second slit SL2 is formed by etching a region in which the seam S is present, the seam S is exposed during the etching process, and an etching rate of a portion around the seam S is increased. Therefore, if the seam S is present in the intersection region, the etching rate of the intersection region is increased compared to that of the non-intersection region, whereby a lower structure may be exposed. On the other hand, according to an embodiment of the present disclosure, the second slit SL2 is formed such that a region of the first slit insulating layer 43 in which the seam S is not present, that is, a region having a relatively small width, is etched. Consequently, the seam S may be prevented from being exposed during the etching process, and the second slit SL2 may be formed with a uniform profile.

Figure 4D:
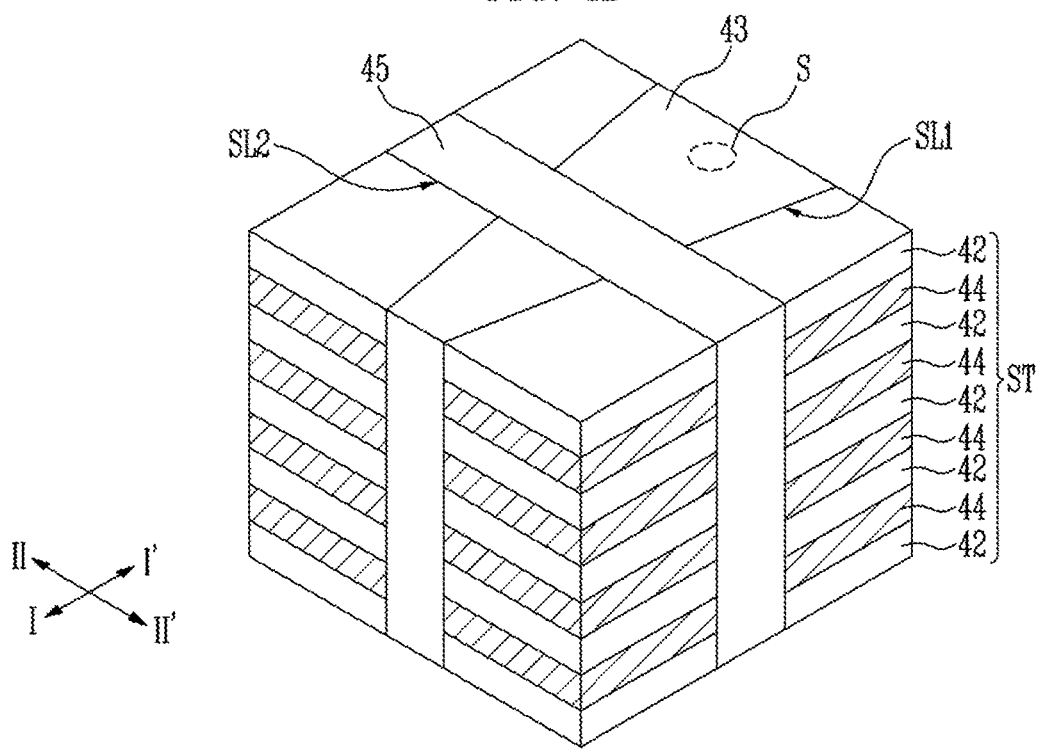

Referring to FIG. 4D, a second slit insulating layer 45 is formed in the second slit SL2. Thereby, an intersection pattern including the first slit insulating layer 43 and the second slit insulating layer 45 are formed.

For reference, depending on the kinds of materials of the first and second material layers 41 and 42, an additional process may be implemented before the second slit insulating layer 45 is formed. For example, in the case where the first material layers 41 are sacrificial layers and the second material layers 42 are insulating layers, a process of replacing the first material layers 41 with conductive layers 44 through the second slit SL2 is performed. In the case where the first material layers 41 are conductive layers and the second material layers 42 are insulating layers, a process of silicidizing the first material layers 41 through the second slit SL2 is performed. In the case where the first material layers 41 are conductive layers and the second material layers 42 are sacrificial layers, a process of replacing the sacrificial layers with insulating layers through the second slit SL2 is performed.

For reference, in a present embodiment, although the description has been made for the case where the first slit insulating layer 43 and the second slit insulating layer 45 are formed to pass through the stack, the present disclosure is not limited to this. For example, the manufacturing process may be performed in such a way that after a first pattern passing through a single layer is formed, a second pattern is formed, or after the first pattern having different widths depending on regions is formed, the second pattern may be formed. Furthermore, the first pattern and the second pattern may be formed of materials having the same property, and include not only an insulating material but also a semiconductor material, a conductive material, and so forth.

Figure 5A:
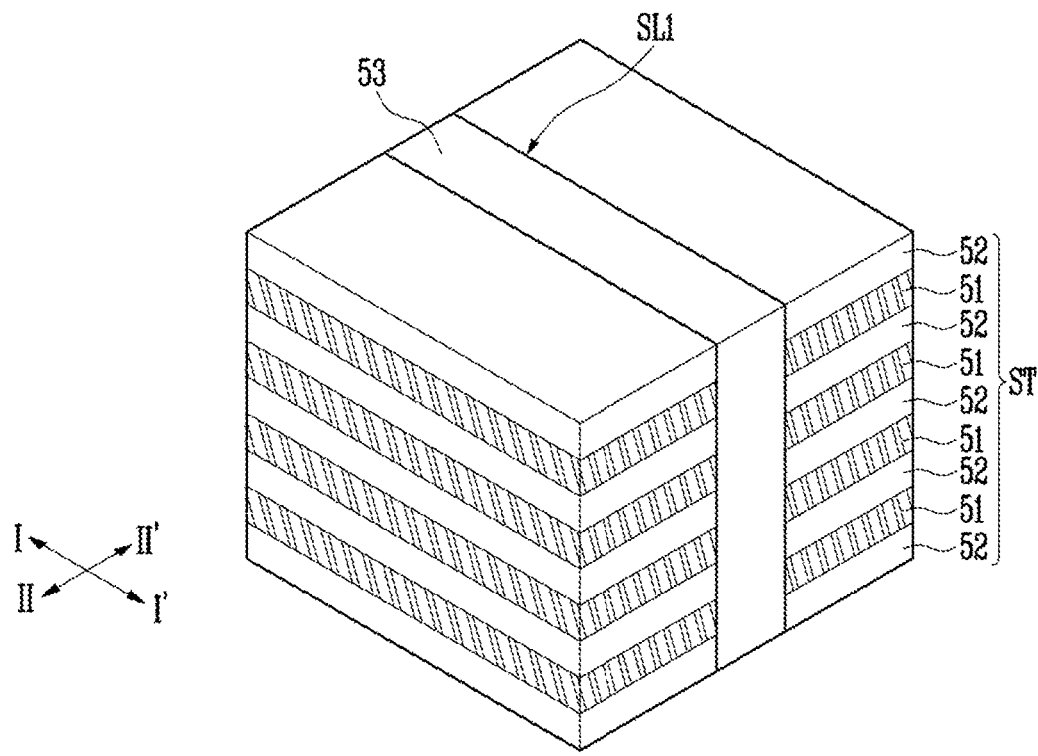
FIGS. 5A to 5C are perspective views illustrating representations of examples of methods of manufacturing a semiconductor device in accordance with an embodiment of the present disclosure.
Figure 5B:
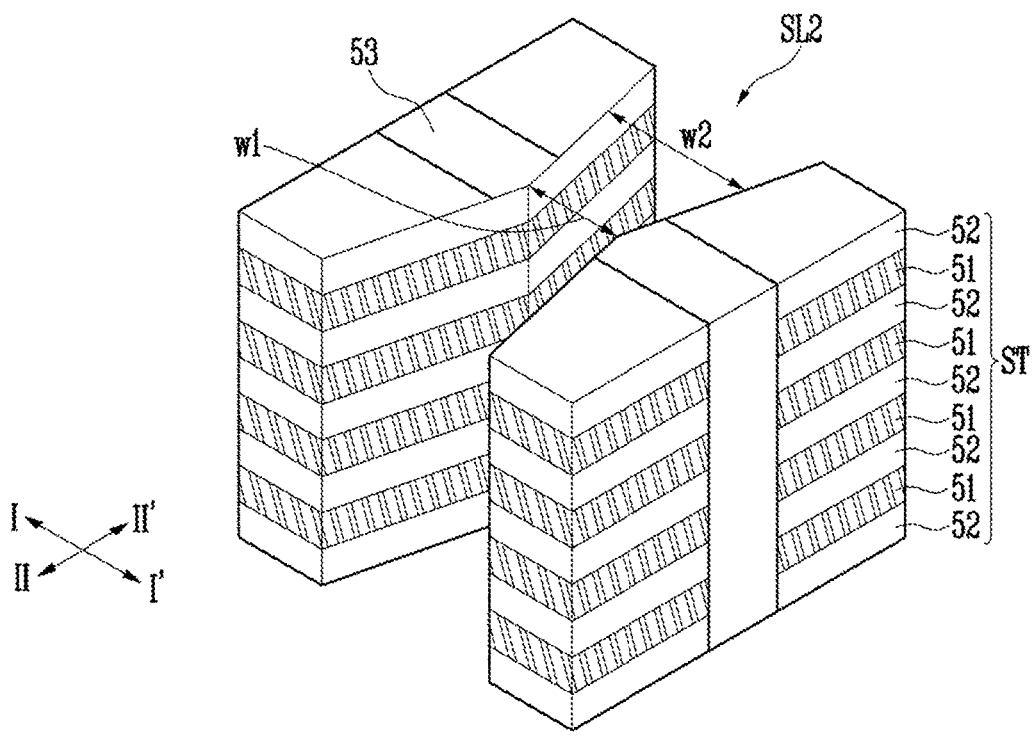
Figure 5C:
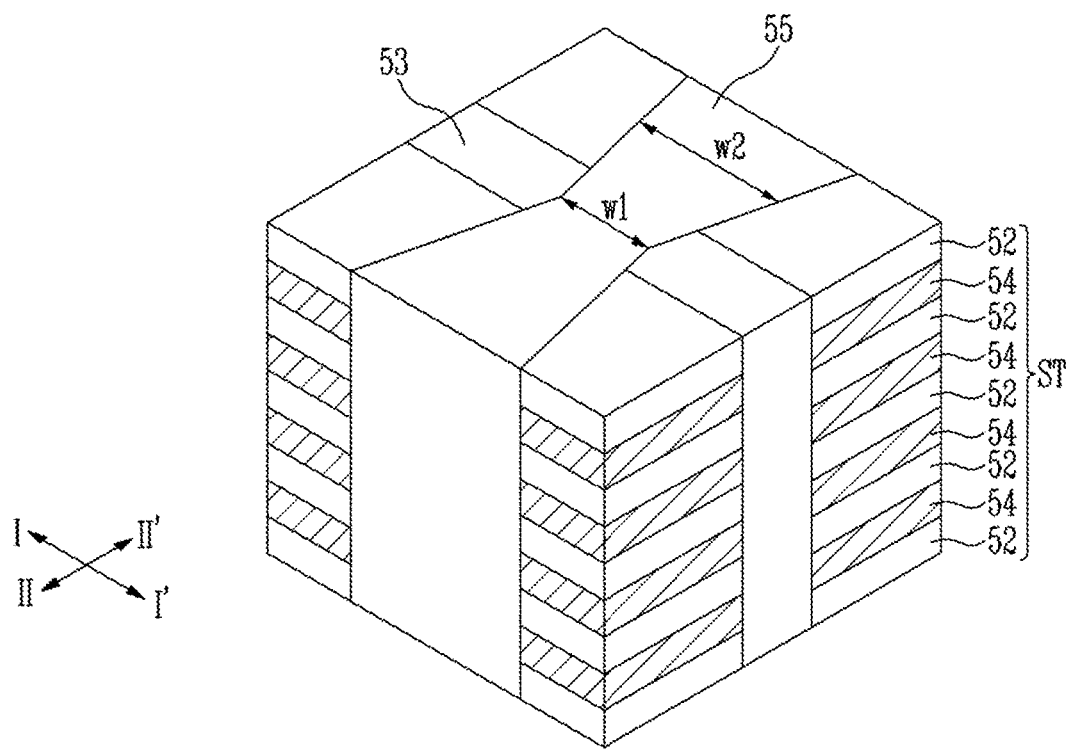

FIGS. 5A to 5C are perspective views illustrating representations of examples of methods of manufacturing a semiconductor device in accordance with an embodiment of the present disclosure. Hereinafter, description will be made for an embodiment in which a first pattern is formed and thereafter a second pattern having different widths depending on regions is formed. Repetitive explanation will be omitted if deemed redundant.

Referring to FIG. 5A, first material layers 51 and second material layers 52 are alternately stacked, thus forming a stack ST. Thereafter, a first slit SL1 passing through the stack ST is formed. The first slit SL1 extends in the first direction I-I'. The first slit SL1 may have a uniform width or different widths depending on regions. Subsequently, a first slit insulating layer 53 is formed in the first slit SL1.

Referring to FIG. 5B, a second slit SL2 is formed to pass through the stack ST and the first slit insulating layer 53 and extend in the second direction II-II'. The second slit SL2 intersects with the first slit insulating layer 53. The first slit insulating layer 53, the first material layers 51 and the second material layers 52 are exposed through the second slit SL2.

The second slit SL2 has different widths depending on regions. For example, the second slit SL2 has a first width w1 in an intersection region in which the second slit SL2 intersects with the first slit insulating layer 53, and has in a non-intersection region a second width w2 greater than the first width w1. The shape of the second slit SL2 may be changed to various shapes, for example, a tapered shape or a ribbon shape, as described above.

In this case, if a seam is present in the first slit insulating layer 53, the seam may be exposed through the second slit SL2, whereby an etching rate of a portion around the seam may be increased. Furthermore, compared to the stack ST formed by stacking different material layers, an etching rate of the first slit insulating layer 53 may be relatively high. Given this, in a present embodiment, the second slit SL2 having a relatively small width is formed in the intersection region so that the area with which the first slit insulating layer 43 is exposed through the second slit SL2 is minimized, whereby the first slit insulating layer 53 may be prevented from being excessively etched.

Referring to FIG. 5C, a second slit insulating layer 55 is formed in the second slit SL2 (see FIG. 5B). The second slit insulating layer 55 has different widths depending on regions. For reference, before the second slit insulating layer 55 is formed, the first material layers 51 may be replaced with conductive layers 54 through the second slit SL2.

The second slit insulating layer 55 may intersect with the first slit insulating layer 53 and have a first width w1 in the intersection region and have in the non-intersection region a second width w2 greater than the first width w1. Furthermore, the second slit insulating layer 55 may include an insulating material such as an oxide and be formed through a deposition process such as an atomic layer deposition process.

Figure 6:
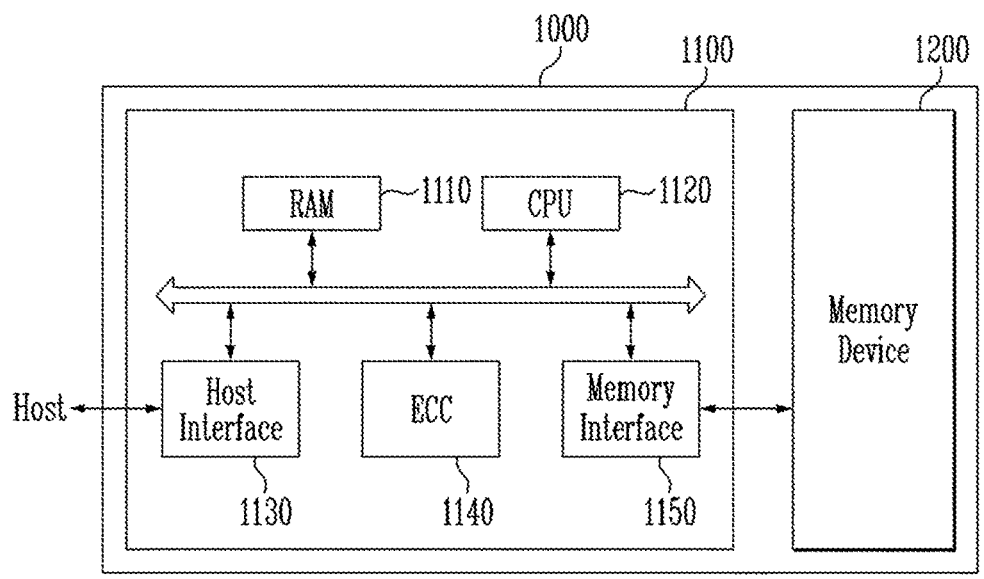
FIGS. 6 and 7 are block diagrams illustrating a representation of an example of the configuration of a memory system in accordance with an embodiment of the present disclosure.

FIG. 6 is a block diagram illustrating a representation of an example of the configuration of a memory system according to an embodiment of the present disclosure.

Referring FIG. 6, the memory system 1000 according to an embodiment of the present disclosure includes a semiconductor memory device 1200 and a controller 1100.

The memory device 1200 is used to store data information having a variety of data forms such as text, graphics, software codes, and so on. The memory device 1200 may be a non-volatile memory and include the structure described with reference to FIGS. 1 to 5C. Furthermore, the memory device 1200 may include a first pattern. The memory device 1200 may include a second pattern which intersects with the first pattern and includes an intersection region with the first pattern and a non-intersection region. The intersection region may have a width less than that of the non-intersection region. The structure of the memory device 1200 and the manufacturing methods thereof may be the same as those described above; therefore detailed explanations thereof will be omitted.

The controller 1100 is coupled to a host and the memory device 1200 and configured to access the memory device 1200 in response to a request from the host. For example, the controller 1100 controls read, write, erase, and background operations of the memory device 1200.

The controller 1100 includes a random access memory (RAM; 1110), a central processing unit (CPU; 1120), a host interface 1130, an error correction code (ECC) circuit 1140, a memory interface 1150, and so on.

The RAM 1110 can be used as an operation memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 is configured to control the overall operation of the controller 1100. For example, the CPU 1120 is configured to operate firmware such as a flash translation layer (FTL) stored in the RAM 1110.

The host interface 1130 is configured to interface with the host. For example, the controller 1100 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 uses an error correction code (ECC) to detect and correct errors in data read from the memory device 1200.

The memory interface 1150 is configured to interface with the memory device 1200. For example, the memory interface 1150 includes a NAND interface or a NOR interface.

For reference, the controller 1100 may further include a buffer memory (not illustrated) for temporarily storing data. The buffer memory may be used to temporarily store data to be transferred from the host interface 1130 to the outside or data to be transferred from the memory interface 1150 to the memory device 1200. The controller 1100 may further include a ROM which stores code data to interface with the host.

Since the memory system 1000 according to an embodiment may include the memory device 1200 having improved integration and characteristics, the integration and characteristics of the memory system 1000 may also be improved.

Figure 7:
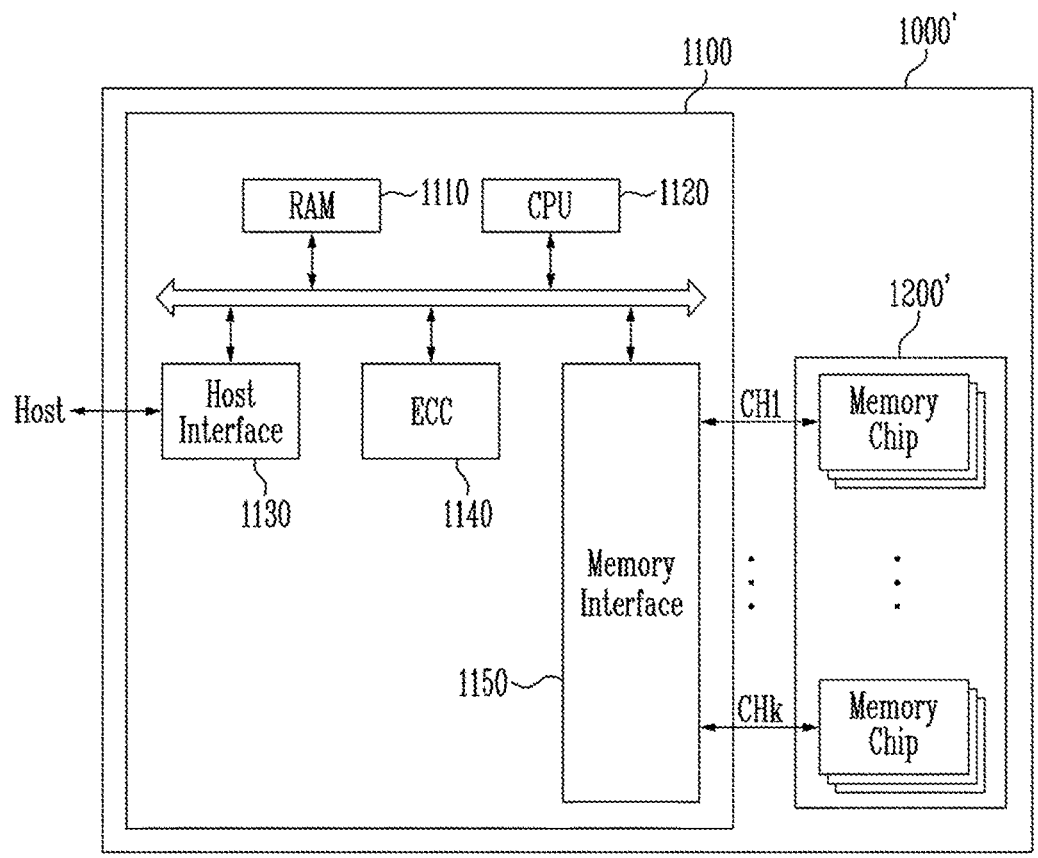

FIG. 7 is a block diagram illustrating a representation of an example of the configuration of a memory system according to an embodiment of the present disclosure. Hereinbelow, repetitive explanation will be omitted if deemed redundant.

Referring to FIG. 7, the memory system 1000' according to an embodiment of the present disclosure includes a memory device 1200' and a controller 1100. The controller 1100 includes a RAM 1110, a CPU 1120, a host interface 1130, an ECC circuit 1140, a memory interface 1150, and so on.

The memory device 1200' may be a non-volatile memory and include the memory string described with reference to FIGS. 1 to 5C. The memory device 1200' may include a first pattern. The memory device 1200' may include a second pattern which intersects with the first pattern and includes an intersection region with the first pattern and a non-intersection region. The intersection region may have a width less than that of the non-intersection region. The structure of the memory device 1200' and the manufacturing methods thereof may be the same as those described above, therefore detailed explanations thereof will be omitted.

Furthermore, the memory device 1200' may be a multi-chip package including a plurality of memory chips. The plurality of memory chips are divided into a plurality of groups. The plurality of groups are configured to communicate with the controller 1100 through first to k-th channels CH1 to CHk. The memory chips of each group communicate with the controller 1100 through a common channel. For reference, the memory system 1000' may be modified such that each single memory chip is coupled to a corresponding single channel.

As described above, since the memory system 1000' according to an embodiment may include the memory device 1200' having improved integration and characteristics, the integration and characteristics of the memory system 1000' may also be improved. In particular, the memory device 1200' according to a present embodiment is formed of a multi-chip package, whereby the data storage capacity and the operating speed thereof can be enhanced.

Figure 8:
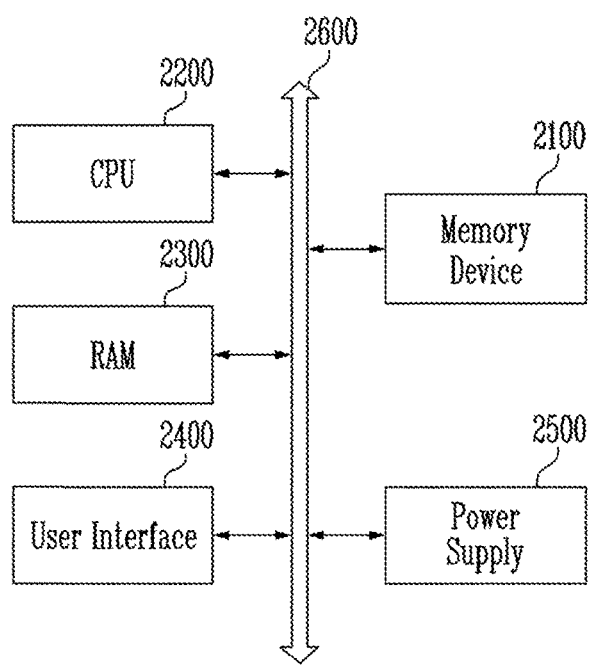
FIGS. 8 and 9 are block diagrams illustrating a representation of an example of the configuration of a computing system in accordance with an embodiment of the present disclosure.

FIG. 8 is a block diagram illustrating the configuration of a computing system according to an embodiment of the present disclosure. Hereinbelow, repetitive explanation will be omitted if deemed redundant.

Referring to FIG. 8, the computing system 2000 according to an embodiment of the present disclosure includes a memory deice 2100, a CPU 2200, a RAM 2300, a user interface 2400, a power supply 2500, a system bus 2600, and so on.

The memory device 2100 stores data provided via the user interface 2400, data processed by the CPU 2200, etc. Furthermore, the memory deice 2100 is electrically coupled to the CPU 2200, the RAM 2300, the user interface 2400, the power supply 2500, etc. by the system bus 2600. For example, the memory device 2100 may be coupled to the system bus 2600 via a controller (not illustrated) or, alternatively, directly coupled to the system bus 2600. In the case where the memory device 2100 is directly coupled to the system bus 2600, the function of the controller may be performed by the CPU 2200, the RAM 2300, etc.

The memory device 2100 may be a non-volatile memory and include the memory string described with reference to FIGS. 1 to 5C. The memory device 2100 may include a first pattern. The memory device 2100 may include a second pattern which intersects with the first pattern and includes an intersection region with the first pattern and a non-intersection region. The intersection region may have a width less than that of the non-intersection region. The structure of the memory device 2100 and the manufacturing methods thereof may be the same as those described above, therefore detailed explanations thereof will be omitted.

As described above with reference to FIG. 7, the memory device 2100 may be a multi-chip package configured with a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to an embodiment may include the memory device 2100 having improved integration and characteristics, the characteristics of the computing system 2000 may also be improved.

Figure 9:
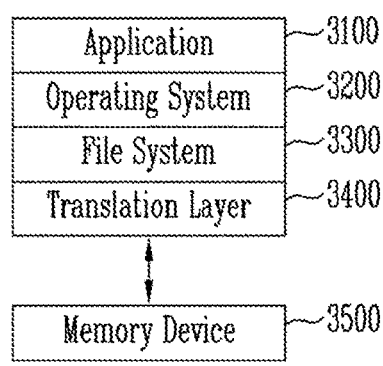

FIG. 9 is a block diagram illustrating a representation of an example of a computing system according to an embodiment of the present disclosure.

Referring to FIG. 9, the computing system 3000 according to an embodiment of the present disclosure has software layers including: an operating system 3200, an application 3100, a file system 3300, a translation layer 3400, and so on. Furthermore, the computing system 3000 includes a hardware layer such as a memory device 3500.

The operating system 3200 manages software resources and hardware resources, etc. of the computing system 3000 and may control program execution by the CPU. The application 3100 may include various application programs to be executed in the computing system 3000 and may be a utility executed by the operating system 3200.

The file system 3300 refers to a logical structure for controlling data, files, etc. which are present in the computing system 3000 and organizes files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed by separate blocks in the drawing, the application 3100 and the file system 3300 may be included in the operating system 3200.

The translation layer 3400 translates an address into a suitable form for the memory device 3500 in response to a request from the file system 3300. For example, the translation layer 3400 translates a logical address produced by the file system 3300 into a physical address of the memory device 3500. Mapping information of the logical address and physical address may be stored in an address translation table. For example, the translation layer 3400 may be a flash translation layer (FTL), a universal flash storage link layer (ULL), or the like.

The memory device 3500 may be a non-volatile memory and include the memory string described with reference to FIGS. 1 to 5C. The memory device 3500 may include a first pattern. The memory device 3500 may include a second pattern which intersects with the first pattern and includes an intersection region with the first pattern and a non-intersection region. The intersection region may have a width less than that of the non-intersection region. The structure of the memory device 3500 and the manufacturing methods thereof may be the same as those described above, therefore detailed explanations thereof will be omitted.

The computing system 300 having the above-mentioned configurations may be divided into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As such, since the computing system 3000 according to an embodiment may include the memory device 3500 having improved integration and characteristics, the characteristics of the computing system 3000 may also be improved.

As described above, a semiconductor device includes an intersection pattern in which a first pattern and a second pattern intersect with each other. An intersection region of the second pattern may have a width less than that of a non-intersection region. Therefore, the position of a seam in the intersection pattern may be controlled, and a lower structure may be prevented from being damaged. Furthermore, a bridge may be prevented from being caused between elements.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present application as set forth in the following claims.

What is claimed is:

1. A method of manufacturing a semiconductor device, comprising:
   forming a stack;
   forming a first slit insulating layer configured to pass through the stack and extend in a first direction, the first slit insulating layer including a first region, and a second region having a width greater than a width of the first region;
   forming a slit configured to pass through the stack and the first slit insulating layer and extend in a second direction intersecting with the first direction, the slit intersecting with the first slit insulating layer in the first region; and
   forming a second slit insulating layer in the slit.

2. The method according to claim 1, wherein the first slit insulating layer has a tapered shape in which a width the first slit insulating layer is increased along the first direction.

3. The method according to claim 1, wherein the first slit insulating layer has a first width on a first edge of the second slit insulating layer and has a second width on a second edge of the second slit insulating layer, and the first width has a value greater than the second width.

4. The method according to claim 3, wherein a distance between the first edge and the end of the first slit insulating layer has a fourth width, and the fourth width has a value greater than ½ of the first width.

5. The method according to claim 4, wherein an end of the first slit insulating layer that is adjacent to the first edge has a third width, and the third width has a value less than the first width and greater than the second width.

6. The method according to claim 1, wherein an end of the first slit insulating layer that is adjacent to the first edge has a third width, and the third width is the same as the first width or has a value greater than the first width.

7. The method according to claim 1, wherein the first slit insulating layer has a minimum width in the first region and is increased in width from the first region to both ends of the first slit insulating layer.

8. The method according to claim 1, wherein the first slit insulating layer has a first width on a first edge of the second slit insulating layer, has a second width on a second edge of the second slit insulating layer, and has a third width between the first edge and the second edge, and the third width has a value less than the first width and the second width.

9. The method according to claim 8, wherein an end of the first slit insulating layer has a fourth width, and the fourth width is the same as the first width or has a value greater than the first width.

10. The method according to claim 9, wherein a distance between the first edge and the end of the first slit insulating layer has a fifth width, and the fifth width has a value greater than ½ of the first width.

11. The method according to claim 8, wherein an end of the first slit insulating layer has a fourth width, and the fourth width has a value less than the first width and greater than the third width.

12. The method according to claim 1, wherein the first slit insulating layer includes a seam disposed in the second region.

13. A method of manufacturing a semiconductor device, comprising:
    forming a stack;
    forming a first slit insulating layer configured to pass through the stack;
    forming a slit configured to pass through the stack and the first slit insulating layer, the slit including a first region configured to intersect with the first slit insulating layer, and a second region configured not to intersect with the first slit insulating layer and having a width greater than a width of the first region; and
    forming a second slit insulating layer in the slit, wherein the second slit insulating layer includes a seam disposed in the second region.

14. The method according to claim 13, wherein the second slit insulating layer has a tapered shape in which a width of the second slit insulating layer is increased along a longitudinal direction of the second slit insulating layer.

15. The method according to claim 13, wherein the second slit insulating layer has a first width on a first edge of the first slit insulating layer and has a second width on a second edge of the first slit insulating layer, and the first width has a value greater than the second width.

16. The method according to claim 15, wherein an end of the second slit insulating layer that is adjacent to the first edge has a third width, and the third width is the same as the first width or has a value greater than the first width.

17. The method according to claim 15, wherein a distance between the first edge and the end of the first slit insulating layer has a fourth width, and the fourth width has a value greater than ½ of the first width.

18. A method of manufacturing a semiconductor device, comprising:
    forming a stack;
    forming a first slit insulating layer configured to pass through the stack;
    forming a slit configured to pass through the stack and the first slit insulating layer, the slit including a first region configured to intersect with the first slit insulating layer, and a second region configured not to intersect with the first slit insulating layer and having a shape such that formation of a seam is restricted to the second region or a position of the seam is controlled to the second region; and forming a second slit insulating layer in the slit.

19. The method according to claim 18, wherein the second region has a width greater than a width of the first region.

* * * * *